(12) United States Patent
Zhao et al.

(10) Patent No.: US 9,007,793 B2
(45) Date of Patent: Apr. 14, 2015

(54) SYNCHRONOUS RECTIFIER DRIVER CIRCUIT RECTIFIER

(75) Inventors: Xiaojian Zhao, Shanghai (CN); Rui Wu, Shanghai (CN); Xin Hu, Shanghai (CN)

(73) Assignee: General Electric Company, Schenectady, NY (US)

( * ) Notice: Subject to any disclaimer, the term of this patent is extended or adjusted under 35 U.S.C. 154(b) by 375 days.

(21) Appl. No.: 13/461,303

(22) Filed: May 1, 2012

(65) Prior Publication Data
US 2012/0307536 A1    Dec. 6, 2012

(30) Foreign Application Priority Data

Jun. 2, 2011   (CN) .......................... 2011 1 0198561

(51) Int. Cl.
| | | |
|---|---|---|
| H02M 3/335 | (2006.01) | |
| H02M 1/088 | (2006.01) | |
| H03K 17/691 | (2006.01) | |

(52) U.S. Cl.
CPC ...... *H02M 3/33592* (2013.01); *Y10T 29/49117* (2015.01); *H02M 1/088* (2013.01); *H03K 17/691* (2013.01); *Y02B 70/1475* (2013.01)

(58) Field of Classification Search
CPC ... H02M 1/08; H02M 1/088; H02M 3/33592; H03K 17/691
USPC ................ 363/17, 21.06, 21.14, 84, 89, 127; 327/424
See application file for complete search history.

(56) References Cited

U.S. PATENT DOCUMENTS

| | | | |
|---|---|---|---|
| 6,256,214 B1* | 7/2001 | Farrington et al. ........... | 363/127 |
| 6,980,441 B2 | 12/2005 | Man-Ho | |
| 7,099,161 B2 | 8/2006 | Yan et al. | |
| 7,148,670 B2 | 12/2006 | Inn et al. | |
| 7,397,290 B2 | 7/2008 | Librizzi et al. | |
| 7,466,168 B1* | 12/2008 | Wittenbreder, Jr. ........... | 327/108 |
| 7,724,555 B1* | 5/2010 | Simopoulos .................. | 363/127 |
| 7,796,408 B2* | 9/2010 | Wang et al. ................. | 363/21.06 |
| 7,911,193 B2 | 3/2011 | Galvano et al. | |
| 7,977,926 B2 | 7/2011 | Williams | |
| 8,228,130 B1 | 7/2012 | Ivanov et al. | |
| 2002/0085402 A1* | 7/2002 | Zhang ........................... | 363/127 |
| 2004/0070994 A1* | 4/2004 | Takagi et al. .................. | 363/16 |
| 2005/0024896 A1 | 2/2005 | Man-Ho | |
| 2006/0098465 A1* | 5/2006 | Fronk ......................... | 363/21.06 |
| 2006/0158165 A1 | 7/2006 | Inn et al. | |
| 2006/0256597 A1 | 11/2006 | Librizzi et al. | |
| 2008/0049456 A1* | 2/2008 | Moromizato et al. ..... | 363/21.06 |
| 2008/0144339 A1* | 6/2008 | Hsieh et al. ................. | 363/21.02 |
| 2009/0161391 A1* | 6/2009 | Matsumoto .................... | 363/24 |
| 2009/0290397 A1* | 11/2009 | Hua et al. ..................... | 363/127 |
| 2009/0323375 A1 | 12/2009 | Galvano et al. | |

(Continued)

*Primary Examiner* — Fred E Finch, III
(74) *Attorney, Agent, or Firm* — General Electric Company

(57) ABSTRACT

A synchronous rectifier includes a primary rectifier circuit and a secondary rectifier circuit. The primary rectifier circuit is configured to produce first and second half-rectified signals from respective first and second primary voltage outputs of a first transformer winding. The secondary rectifier circuit is configured to rectify a voltage output of a second transformer winding in response to first and second transistor gate inputs. A first buffer driver is configured to receive the first half-rectified signal and to provide a first buffered control signal to the first transistor gate input. A second buffer driver is configured to receive the second half-rectified signal and to provide a second buffered control signal to the first transistor gate input.

17 Claims, 6 Drawing Sheets

(56) References Cited

U.S. PATENT DOCUMENTS

| | | | |
|---|---|---|---|
| 2010/0046259 A1* | 2/2010 | Ho et al. | 363/126 |
| 2011/0149616 A1* | 6/2011 | Svardsjo | 363/24 |
| 2011/0199799 A1* | 8/2011 | Hui et al. | 363/127 |
| 2012/0206210 A1 | 8/2012 | Ivanov et al. | |
| 2012/0307536 A1 | 12/2012 | Zhao et al. | |
| 2013/0009674 A1* | 1/2013 | Reese et al. | 327/109 |
| 2013/0094251 A1* | 4/2013 | Yin et al. | 363/21.06 |
| 2013/0170252 A1* | 7/2013 | Nishino et al. | 363/21.02 |

* cited by examiner

SYNCHRONOUS RECTIFIER DRIVER CIRCUIT RECTIFIER

CROSS REFERENCE TO RELATED APPLICATIONS

This application claims priority under 35 U.S.C. §119 to Chinese patent application 201110198561.3, filed Jun. 2, 2011, the disclosure of which is incorporated herein by reference in its entirety.

TECHNICAL FIELD

This application is directed, in general, to power conversion and, more specifically, to synchronous rectifiers and methods of operating and forming synchronous rectifiers.

BACKGROUND

Some synchronous, or active, rectifiers provide improved efficiency over diode-bridge rectifiers in part by reducing resistive losses by replacing the diodes with transistors, e.g. metal-oxide-semiconductor field-effect transistors (MOSFETs). The MOSFETs may have a very low on-resistance, e.g. 10 mΩ, compared to a constant junction-voltage drop across the diodes, e.g. about 0.7-1.2 volts.

As the driving loss of the conventional self-driving circuit is very large in wide input voltage range design, continuing research has been undertaken to improve the efficiency of the synchronous rectifier driver circuit. While the efficiency of synchronous rectifiers is significantly greater than diode-bridge rectifiers, power loss of the self-driving clamp MOSFETs imposes a lower limit on the efficiency of conventional self-driving designs. New solutions are needed to further reduce losses in synchronous rectifier driving circuits while doing so with low cost.

SUMMARY

One aspect provides a synchronous rectifier that includes primary and secondary rectifier circuits. The primary rectifier circuit is configured to produce first and second half-rectified signals from respective first and second primary voltage outputs of a first transformer winding. The secondary rectifier circuit is configured to rectify a voltage output of a second transformer winding in response to first and second transistor gate inputs. A first buffer driver is configured to receive the first half-rectified signal and to provide a first buffered control signal to the first transistor gate input. A second buffer driver is configured to receive the second half-rectified signal and to provide a second buffered control signal to the first transistor gate input.

Another aspect provides a method of forming a synchronous rectifier. The method includes the step of configuring a primary rectifier circuit to produce first and second half-rectified signals from first and second primary voltage outputs of a first transformer winding. In another step a secondary rectifier circuit is configured to rectify a voltage output of a second transformer winding in response to first and second transistor gate inputs. In another step a first buffer driver is configured to receive the first half-rectified signal and to provide a first buffered control signal to the first transistor gate input. In another step a second buffer driver is configured to receive the second half-rectified signal and to provide a second buffered control signal to the first transistor gate input.

Another aspect provides a method of operating a synchronous rectifier. The method includes the step of producing first and second half-rectified signals from respective first and second primary voltage outputs of a first transformer winding. In another step the first and second half-rectified signals are buffered with respective first and second buffer drivers to produce respective first and second control signals. In another step an output of the first control signal is coupled to ground when under control of the second rectifier control signal. In another step an output of the second buffer driver is coupled to ground under control of the first rectifier control signal.

Yet another aspect provides a synchronous rectifier. The rectifier includes MOSFETs S1 and S2. The MOSFET S1 has a drain connected to a first terminal of a first transformer winding. The MOSFET S2 has a drain connected to a second terminal of the first transformer winding. An input of a first buffer driver is connected to a source of the MOSFET S1. An input of a second buffer driver is connected to a source of the MOSFET S2. A MOSFET S3 has a gate connected to the input of the second buffer driver, a source connected to ground and a drain configured to receive an output voltage from the first buffer driver. A MOSFET S4 has a gate connected to the input of the first buffer driver, a source connected to ground and a drain configured to receive an output voltage from the second buffer driver. A MOSFET Q1 has a drain connected to a first terminal of a second transformer winding, a source connected to ground and a gate configured to receive the output voltage from the first buffer driver. A MOSFET Q2 has a drain connected to a second terminal of the second transformer winding, a source connected to ground and a gate configured to receive the output voltage from the second buffer driver.

BRIEF DESCRIPTION

Reference is now made to the following descriptions taken in conjunction with the accompanying drawings, in which.

DETAILED DESCRIPTION

Embodiments presented herein describe a new synchronous rectifier (SR) drive circuit for power converters. In applications involving a wide range of input voltages, a conventional SR self-driving circuit is typically not suitable, as there may be large resistive losses and thermal issues involving linear clipping MOSFETs used in the synchronous FET drive. Some conventional synchronous rectifier drive solutions use a digital isolator to transfer a control signal from a primary control integrated circuit (IC) to a secondary driver IC, with an RC delay circuit to adjust the delay time between primary and secondary sides. Although this solution may achieve high efficiency in some cases, the circuit includes many components, and is thus typically complex and/or costly. Embodiments of the present disclosure provide an improved SR driver strategy that provides low driver-related loss and may be less costly to manufacture than conventional synchronous rectifier drive solutions.

Figure 1:
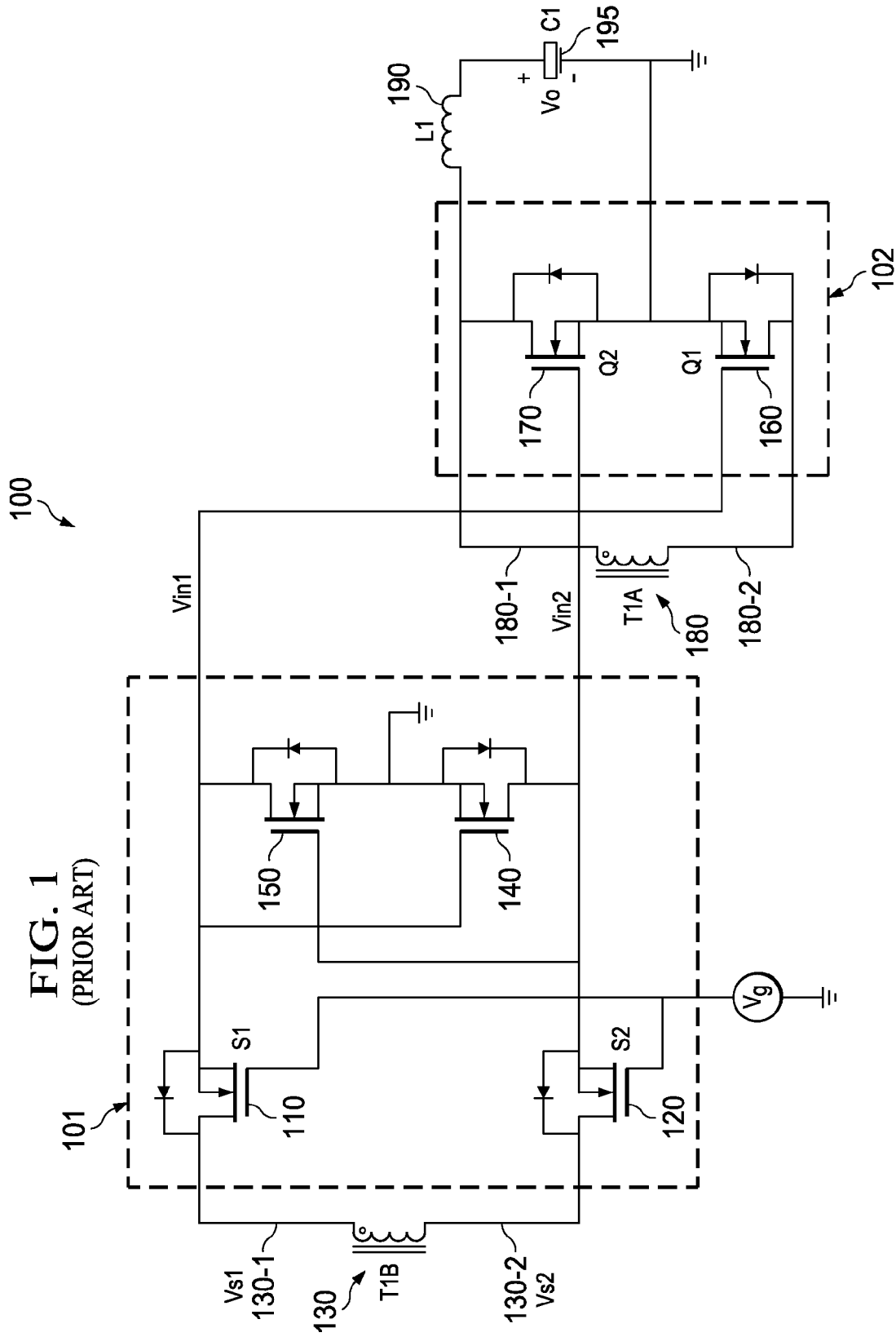
FIG. 1 illustrates aspects of a prior art synchronous rectifier.

FIG. 1 illustrates a prior art SR circuit 100 that is representative of some conventional SR circuits. The circuit 100 includes a primary rectifier circuit 101 and a secondary rectifier circuit 102. The primary rectifier circuit 101 includes MOSFETs S1 110 and S2 120, and clipping MOSFETs 140, 150. The secondary rectifier circuit 102 includes MOSFETs Q1 160 and Q2 170. In some cases the components of the primary rectifier circuit 101 are integrated in a control IC, and the components of the secondary rectifier circuit 102 are integrated in a driver IC.

The MOSFETs S1 110 and S2 120 are biased with a gate voltage Vg and are thus always "on", e.g. provide a relatively low resistance path between the source and the drain of the device. The drains of each of S1 110 and S2 120 are connected to terminals 130-1 and 130-2 of a primary winding T1B 130 of a transformer T1. The winding T1B 130 produces a time-varying (AC) voltage across the terminals 130-1, 130-2. The voltage at the terminal 130-1 is designated Vs1, and the voltage at the terminal 130-2 is designated Vs2. The voltage at the S1 110 source is designated $V_{in1}$, and the voltage at the S2 120 source is designated $V_{in2}$.

The source of S1 110 is connected to the gate of the MOSFET 140. The source of S2 120 is connected to the gate of the MOSFET 150. When Vs1>0, the MOSFET 140 clips $V_{in2}$ to about ground. When Vs2>0 the MOSFET 150 clips $V_{in1}$ to about ground. Thus, each of $V_{in1}$ and $V_{in2}$ is a half-rectified portion of the AC voltage produced at the respective terminals 130-1, 130-2.

The drains of a MOSFET Q1 160 and a MOSFET Q2 170 are respectively connected to a terminal 180-2 and a terminal 180-1 of a secondary winding T1A 180 of the transformer T1. When $V_{in1}$ is positive, Q1 160 is on and Q2 170 is off. The terminal 180-2 is grounded, setting a ground reference for the voltage at the terminal 180-1. The voltage at the terminal 180-1 therefore follows the positive phase of the AC output of the winding T1A 180. When $V_{in2}$ is positive, Q2 170 is on, thereby grounding the terminal 180-1. Thus the voltage at the terminal 180-2 is half-rectified. An LC filter formed by an inductor L1 190 and a capacitor C1 195 is charged by the periodic positive cycles of the voltage at the terminal 180-1, thereby providing a substantially DC voltage V0 across the terminals of C1 195.

To improve performance in wide input voltage range design applications, some conventional SR circuits include a driver between the primary rectifier circuit 101 and the secondary rectifier circuit 102. Such drivers may, e.g. reduce transient current flow through S1 110 and S2 120. However, delays in the drivers may result in Q1 160 and Q2 170 being briefly simultaneously turned on. In such cases, a low resistance path between the terminals 180-1 and 180-2 of the winding T1A 180 causes a high current transient with resulting resistive loss and joule heating of Q1 160 and Q2 170 and the winding T1A. This power loss decreases the efficiency of the SR circuit 100 and may lead to lower reliability and/or the need to dissipate the heat for the SR circuit 100.

Some conventional attempts to reduce these resistive losses have used a digital isolator and an RC delay circuit to adjust the delay time between primary and secondary sides of the transformer T1. Conventional implementations of this approach typically require more components that result in added circuit complexity and cost, and may be less reliable due to additional potential sources of failure.

Figure 2:
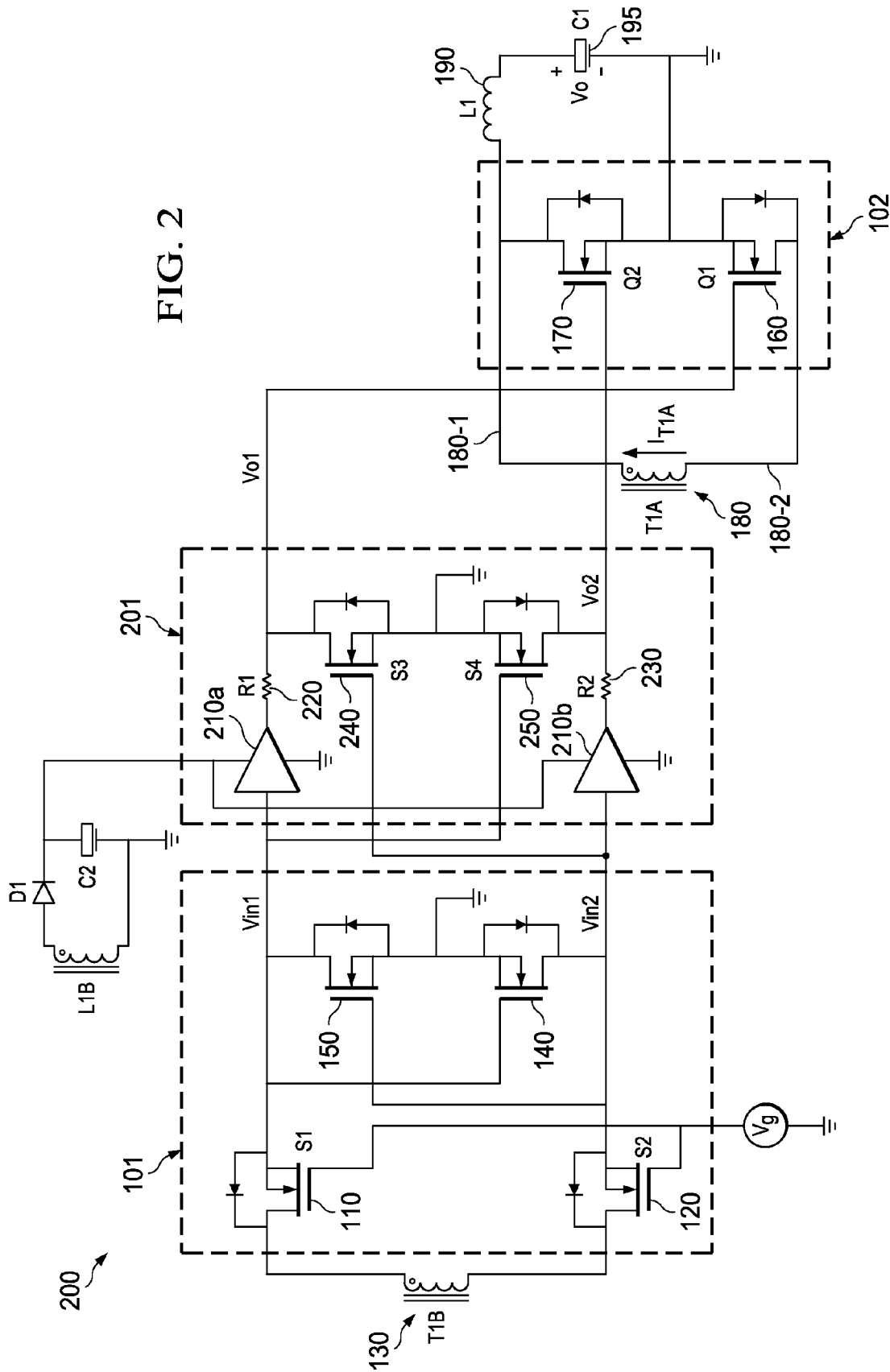
FIG. 2 illustrates a synchronous rectifier according to one embodiment in accordance with the disclosure.

FIG. 2 illustrates in one embodiment of the disclosure a synchronous rectifier 200 that provides improved conversion efficiency with significantly lower complexity and cost than some conventional implementations as described above. The synchronous rectifier 200 includes the primary rectifier circuit 101 and the secondary rectifier circuit 102 previously described. Embodiments of the disclosure explicitly include variations of the primary rectifier circuit 101 and the secondary rectifier circuit 102 that may differ in form while providing substantially the same functionality as the illustrated rectifier circuits 101 and 102.

Interposed between the rectifier circuits 101, 102 is an isolation circuit 201. The isolation circuit 201 includes buffer drivers 210a and 210b, resistors R1 220 and R2 230, and MOSFETs S3 240 and S4 250. As used in this discussion and in the claims, a buffer driver is a circuit that amplifies a drive current capability of an electrical signal input to the buffer driver. The gain of the buffer driver is not limited to any particular value. For example, a buffer driver may receive a 100 µA current at its input and drive a load with about 1 A or more. A buffer driver may be, e.g. a conventional driver.

The isolation circuit 201 receives input signals $V_{in1}$ and $V_{in2}$, and provides buffered control signals $V_{o1}$ and $V_{o2}$ respectively to gates of Q1 160 and Q2 170. The buffer drivers 210a, 210b may be powered by inductively coupling a winding L1B to the inductor L1. An AC voltage produced by the winding L1B may be rectified by a diode D1 and a capacitor C2.

The isolation circuit 201 serves several functions in the synchronous rectifier 200. First, the buffer drivers 210a, 210b isolate the MOSFETs S1 110 and S2 120 from the MOSFETs Q1 160 and Q2 170. This aspect may reduce current through S1 110 and S2 120 that is caused by capacitive switching at the gates of Q1 160 and Q2 170. Second, the buffer drivers may provide relatively uniform switching current to Q1 160 and Q2 170 over a wider range of voltage provided by the winding T1B 130. A third related function provided by the buffer drivers 210a, 210b is the reduction of switching time, e.g. rise and fall times of the gate voltages of Q1 160 and Q2 170 that may provide greater precision of timing the on and off states of Q1 160 and Q2 170.

In spite of these beneficial effects, the buffer driver 210a may impose a small delay between $V_{in1}$ and the gate of Q1 160. Similarly the buffer driver 210b may impose a small delay between $V_{in2}$ and the gate of Q2 170. If not mitigated, these delays can lead to simultaneous conduction through Q1 and Q2, with resulting power loss and reduced lifetime of Q1 and Q2.

Figure 3:
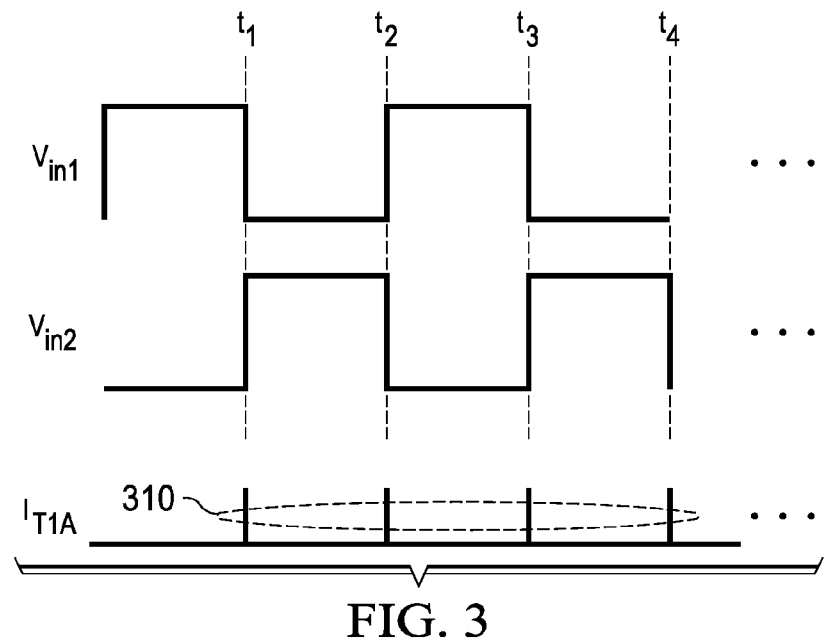
FIGS. 3 and 4 illustrate aspects of signal timing of signals in various embodiments, e.g. the synchronous rectifier of FIG. 2.

For example, FIG. 3A illustrates voltage traces of $V_{in1}$ and $V_{in2}$ for the synchronous rectifier 200 without the presence of S3 240 and S4 250. A current trace $I_{T1A}$ is representative of current through the winding T1A 180, Q1 160 and Q2 170. $V_{in1}$ and $V_{in2}$ are half-rectified signals. At times t1, t2, t3 and t4 Q1 160 and Q2 170 may be briefly simultaneously in an "on" state. Thus, $I_{T1A}$ includes periodic current spikes 310 at the zero-crossings of $V_{in1}$ and $V_{in2}$.

Figure 4:
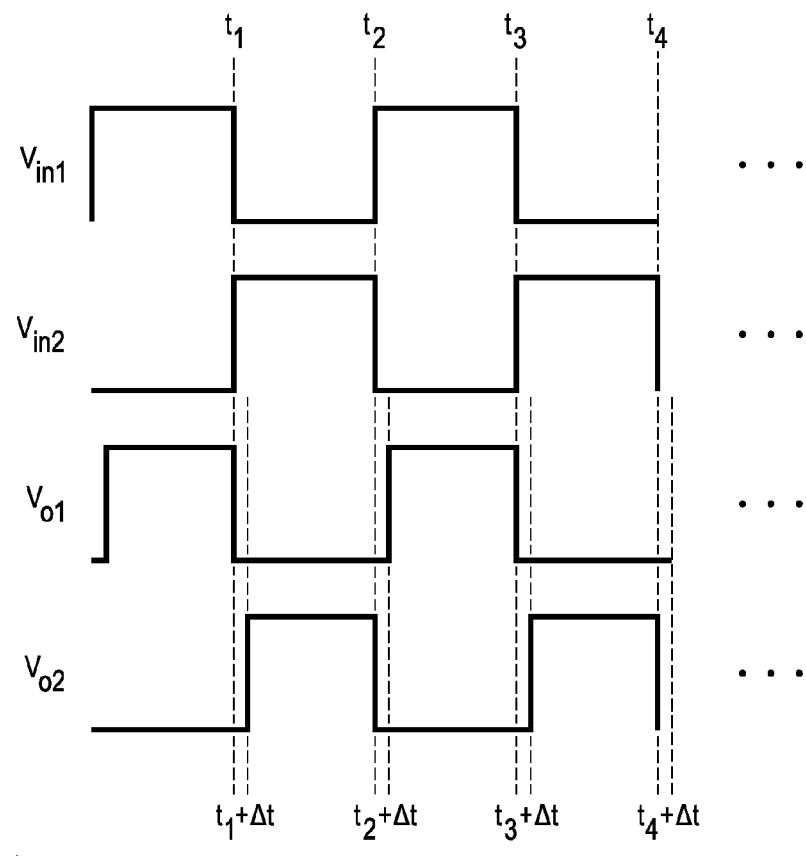

FIG. 4 illustrates voltage traces of $V_{in1}$, $V_{in2}$, $V_{o1}$ and $V_{o2}$ for the synchronous rectifier 200 including the transistors S3 240 and S4 250. S3 240 and S4 250 receive feed-forward communication of the $V_{in1}$ and $V_{in2}$ signals to substantially prevent the occurrence of the current spikes 310. $V_{o1}$ lags Vin 1 by Δt, and $V_{o2}$ lags $V_{in2}$ by Δt, wherein Δt is the delay imposed by the buffer drivers 210a and 210b. First considering $V_{o1}$, immediately prior to T1 this signal follows the form of $V_{in1}$. The buffer driver 210a may have unity or non-unity gain. The transistor S3 240 is off because $V_{in2}$ is clipped to ground by the MOSFET 140. At time t1, $V_{in1}$ falls below the turn-on voltage of S4 250, thereby turning S4 250 off, and $V_{in2}$ begins to increase. The rise of $V_{in2}$ turns on S3 240, clipping $V_{o1}$ to ground. $V_{in2}$ is buffered by the buffer driver 210b, which again may have unity or non-unity gain. $V_{o2}$ follows $V_{in2}$ with a time lag. At T2 $V_{in1}$ again increases, turning on S4 250. $V_{o2}$ is clipped to ground by S4 250. $V_{o1}$ follows $V_{in1}$ with the time lag Δt. Subsequent periods of $V_{in1}$, $V_{in2}$, $V_{o1}$ and $V_{o2}$ continue to follow the described pattern.

By examination of $V_{o1}$ and $V_{o2}$ it is apparent that these signals are not simultaneously active, e.g. greater than zero volts. Thus Q1 and Q2 will not be simultaneously in an "on" state and the current spikes 310 (FIG. 3) are substantially eliminated.

Figure 5:
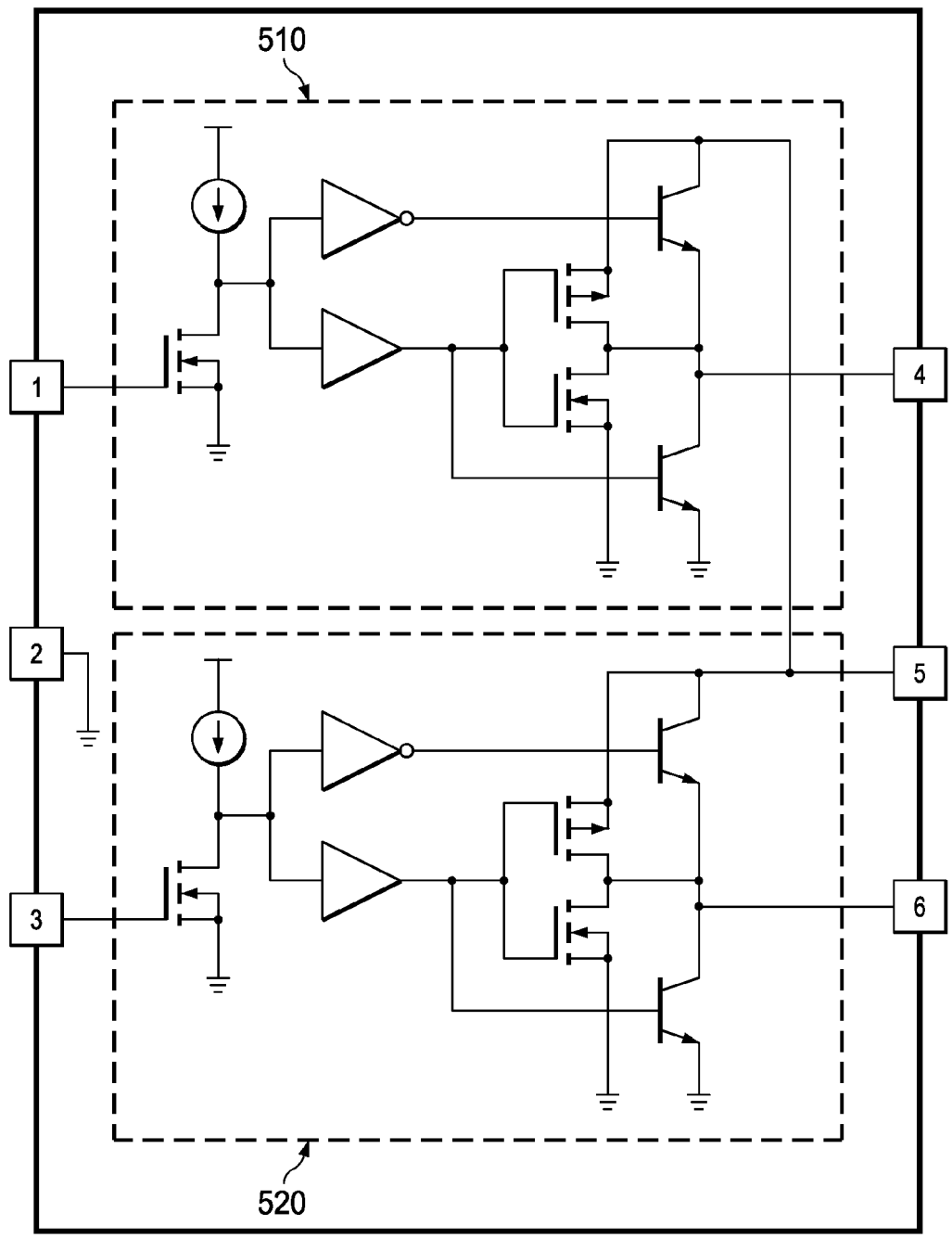
FIG. 5 illustrates internal functionality of an integrated driver circuit that may be used in some embodiments to provide buffer drivers used in the synchronous rectifier of FIG. 2.

Turning to FIG. 5, a driver circuit 500 that includes first and second buffer driver circuits 510 and 520. The driver circuit 500 includes terminals 1-6. The buffer driver circuit 510 has an input at terminal 1 and an output at terminal 4. The buffer driver circuit 520 has an input at terminal 3 and an output at terminal 6. Each buffer driver circuit 510, 520 provides the functionality of one of the buffer drivers 210a, 210b. In various embodiments the buffer driver circuit 500 is a commercially available integrated circuit with at least two independent buffer driver circuits. The circuit 510 may operate as the buffer driver 210a, while the circuit 520 may operate as the buffer driver 210b. Power and ground may respectively be applied to terminals 5 and 2.

In some embodiments the buffer driver circuits 510, 520 are high performance buffer drivers. Herein and in the claims a high performance buffer driver is characterized by the following attributes:

1) capable of driving peak loads of at least about 1 ampere, 2) has a rise time response to a step-function input no greater than about 150 ns while driving a load of about 2 nF, and 3) has a fall time response to a step function input no greater than about 150 ns while driving a load of about 2 nF.

In some embodiments the peak load drive capacity is at least about 4 amperes, the rise time response time is about 20 ns or less for a load of about 1.8 nF, and the fall time is less than about 15 ns for a load of about 1.8 nF.

In one embodiment, the driver circuit 500 is provided by a commercially available integrated circuit that includes two or more drivers, e.g. such as the buffer drivers circuits 510, 520. In one non-limiting example, part number UCC27324 manufactured by Texas Instruments, Dallas, Tex., USA may be used. Those skilled in the pertinent art will appreciate that the buffer driver circuits 510, 520 may be equivalently formed using discrete components. Furthermore, embodiments of the circuit 500 that provide functionally similar operation to the UCC27324 are included in the scope of the disclosure.

Figure 6:
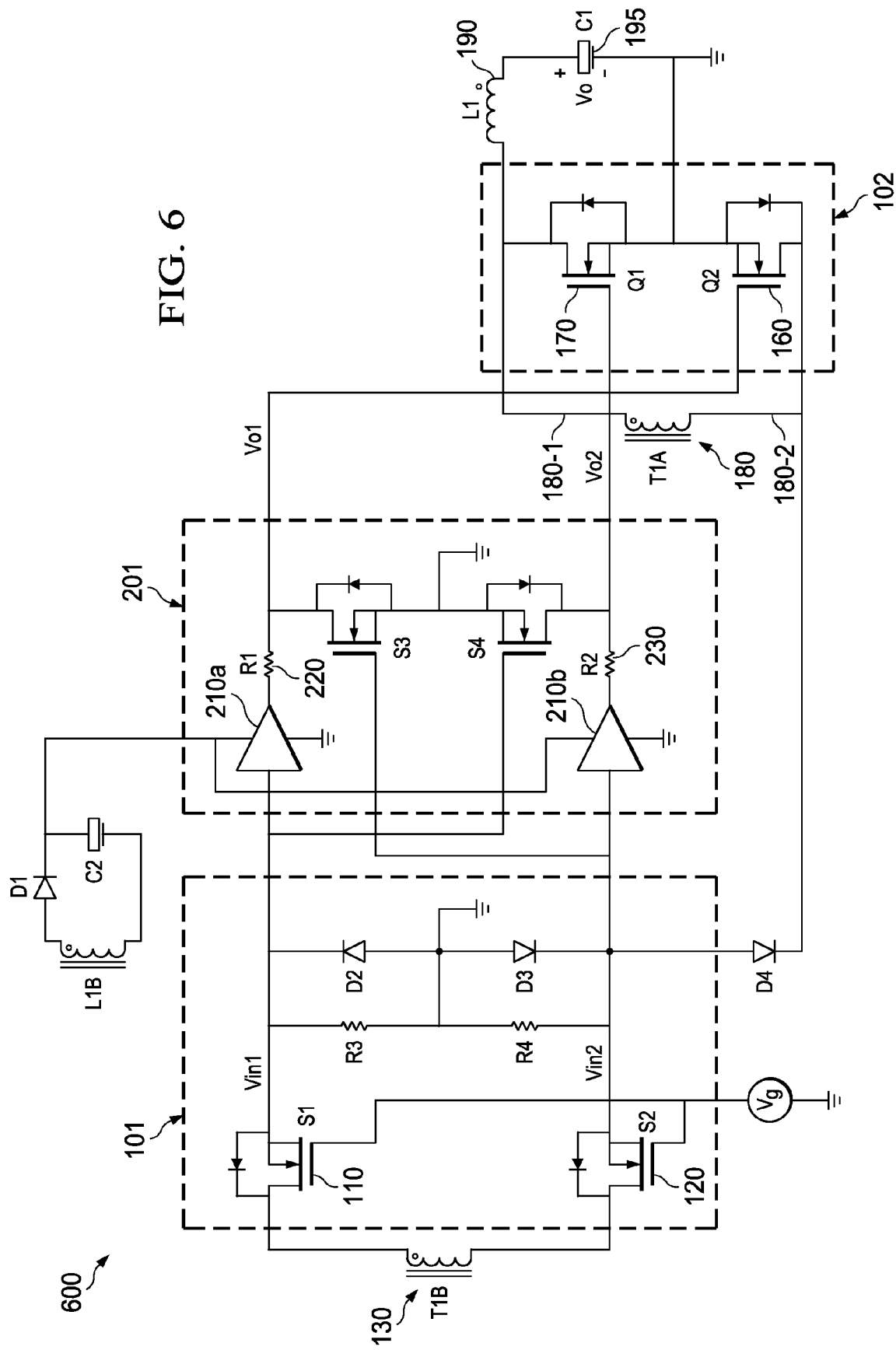
FIG. 6 illustrates a synchronous rectifier according to one embodiment in which some MOSFETS in the embodiment of FIG. 2 are replaced with diodes.

FIG. 6 illustrates a synchronous rectifier 600 in another embodiment of the invention. The synchronous rectifier 600 replaces the MOSFETs 140 and 150 of the synchronous rectifier 200 with a network of resistors R3, R4 and diodes D2, D3. The synchronous rectifier 600 may operate as described with respect to the synchronous rectifier 200, with the exception of aspects now described. The anode of the diode D2 is connected to ground and the cathode is connected to $V_{in1}$. The resistor R3 is connected in parallel with D2. The anode of the diode D3 is connected to ground and its cathode is connected to $V_{in2}$. A resistor R4 is connected in parallel with D3. The diode D2 operates to clip $V_{in1}$ to a value no less than about ground less junction voltage drop of D2. The diode D3 operates to clip $V_{in2}$ to a value no less than about ground less the diode drop of D3.

The synchronous rectifier 600 also includes in some embodiments a diode D4 with its anode connected to $V_{in2}$ and its cathode connected to the transformer terminal 180-2. When $V_{in1}$ is positive, Q1 is turned on, grounding the transformer terminal 180-2. The voltage at the terminal 180-2 is then referenced to ground, and the terminal 180-2 provides an output voltage determined by the transformer characteristics. When $V_{in2}$ is positive, the terminal 180-2 is referenced to $V_{in2}$ less the D4 diode drop). An effect of D4 is to ensure that Vin2 is about grounded when Vo1 turns on Q1.

Figure 7:
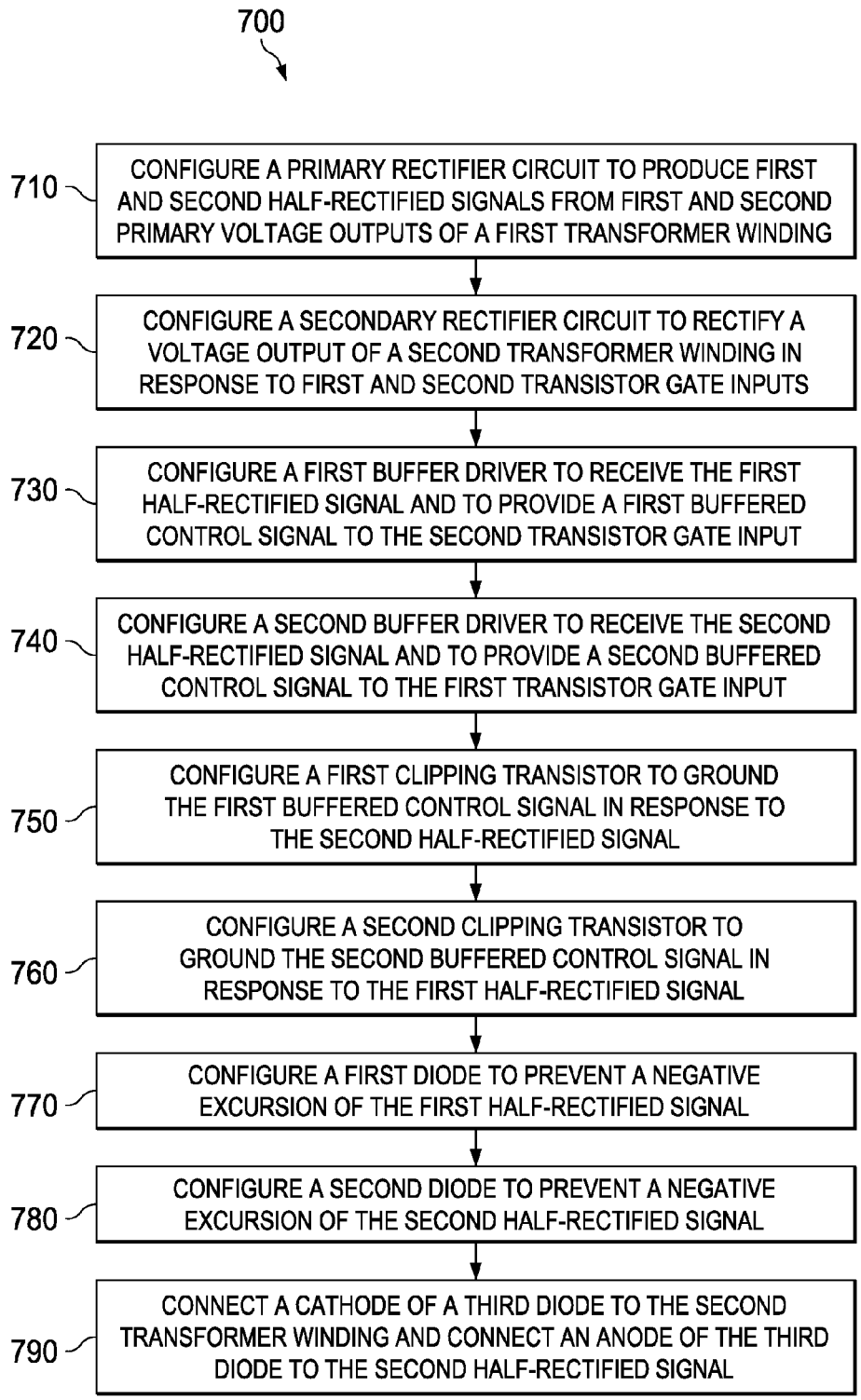
FIG. 7 presents a method of forming a synchronous rectifier according to various embodiments of the disclosure, e.g. the synchronous rectifiers 200 and 600.

Turning to FIG. 7, a method 700 is presented, e.g. of forming a synchronous rectifier, such as the synchronous rectifiers 200 and 600. The method 700 is described without limitation in terms of features described herein, e.g. in FIGS. 2, 4, 5 and 6. Embodiments of the disclosure include variations on the method 700, such as performing the steps in an order other than the illustrated order.

In a step 710, a primary control circuit is configured to receive first and second primary voltage outputs of a first transformer winding. First and second half-rectified signals are produced from the first and second primary voltage outputs. In a step 720 first and second buffer drivers are configured to produce first and second control signals from the first and second half-rectified signals. In a step 730 a secondary rectifier circuit is configured to rectify a voltage output of a second transformer winding in response to the first and second half-rectified signals. In a step 740 a first clipping transistor is configured to ground the first control signal in response to the second half-rectified signal. In a step 750 a second clipping transistor is configured to ground the second control signal in response the first half-rectified signal.

In a step 760 the first half-rectified signal is coupled to ground via a first resistor and a first diode arranged in parallel with the first resistor. The second half-rectified signal is coupled to ground via a second resistor and a second diode arranged in parallel with the second resistor. In a step 770 a third diode is coupled between the second half-rectified signal and the first terminal.

Those skilled in the art to which this application relates will appreciate that other and further additions, deletions, substitutions and modifications may be made to the described embodiments.

What is claimed is:

1. A synchronous rectifier, comprising:
   a primary rectifier circuit configured to receive first and second primary voltage outputs of a first transformer winding and to produce a first half-rectified signal and a second half-rectified signal therefrom;
   a secondary rectifier circuit configured to rectify a voltage output of a second transformer winding in response to a first transistor gate input and a second transistor gate input;
   a first buffer driver configured to receive said first half-rectified signal and to provide a first buffered control signal to said first transistor gate input;
   a second buffer driver configured to receive said second half-rectified signal and to provide a second buffered control signal to said second transistor gate input;
   a first clipping transistor configured to ground said first buffered control signal in response to said second half-rectified signal; and
   a second clipping transistor configured to ground said second buffered control signal in response to said first half-rectified signal.

2. The synchronous rectifier of claim 1, further comprising:
   a first diode configured to prevent a negative excursion of said first half-rectified signal; and
   a second diode configured to prevent a negative excursion of said second half-rectified signal.

3. The synchronous rectifier of claim 1, wherein said secondary rectifier circuit includes a filter inductor configured to provide operating power to said first buffer driver and said second buffer driver.

4. The synchronous rectifier of claim 1, wherein said first buffer driver and said second buffer driver are high performance buffer drivers.

5. The synchronous rectifier of claim 1, further comprising a diode having a cathode connected to said second transformer winding and an anode connected to an input of said second buffer driver.

6. The synchronous rectifier of claim 1, wherein said first transformer winding and said second transformer winding are windings of a same transformer.

7. The synchronous rectifier of claim 1, wherein said second transformer winding has a first terminal and a second terminal, and said secondary rectifier circuit includes:
   a first MOSFET, connected between ground and said first terminal, and controlled by said first buffered control signal;
   a second MOSFET, connected between ground and said second terminal, and controlled by said second buffered control signal; and
   a diode coupled between said second half-rectified signal and said first terminal.

8. A method of forming a synchronous rectifier, comprising:
   configuring a primary rectifier circuit to produce a first half-rectified signal and a second half-rectified signal from first and second primary voltage outputs of a first transformer winding;
   configuring a secondary rectifier circuit to rectify a voltage output of a second transformer winding in response to a first transistor gate input and a second transistor gate input;
   configuring a first buffer driver to receive said first half-rectified signal and to provide a first buffered control signal to said first transistor gate input;
   configuring a second buffer driver to receive said second half-rectified signal and to provide a second buffered control signal to said second transistor gate input;
   configuring a first clipping transistor to ground said first buffered control signal in response to said second half-rectified signal; and
   configuring a second clipping transistor to ground said second buffered control signal in response to said first half-rectified signal.

9. The method of claim 8, further comprising:
   configuring a first diode to prevent a negative excursion of said first half-rectified signal; and
   configuring a second diode to prevent a negative excursion of said second half-rectified signal.

10. The method of claim 8, wherein said secondary rectifier circuit includes a filter inductor configured to provide operating power to said first buffer driver and said second buffer driver.

11. The method of claim 8, wherein said first buffer driver and said second buffer driver are high performance buffer drivers.

12. The method of claim 8, further comprising connecting a cathode of a diode to said second transformer winding and connecting an anode of said diode to an input of said second buffer driver.

13. The method of claim 8, wherein said first transformer winding and said second transformer winding are windings of a same transformer.

14. A method of operating a synchronous rectifier, comprising:
   respectively producing a first half-rectified input signal and a second half-rectified input signal from first and second primary voltage terminals of a first transformer winding;
   delaying said first half-rectified input signal and said second half-rectified input signal with respective buffer drivers to produce a first output signal and a second output signal;
   coupling said first output signal to ground upon detecting a rising edge of said second half-rectified input signal and before a rising edge of said second output signal; and
   coupling said second output signal to ground upon detecting a rising edge of said first half-rectified input signal and before a rising edge of said first output signal.

15. The method of claim 14, further comprising controlling a secondary rectifier circuit to produce a supply voltage to provide operating power to said respective buffer drivers.

16. The method of claim 14, further comprising respectively employing first and second diodes to clip negative voltage excursions of said first half-rectified input signal and said second half-rectified input signal.

17. A synchronous rectifier, comprising:
   a first MOSFET having a drain connected to a first terminal of a first transformer winding;
   a second MOSFET having a drain connected to a second terminal of said first transformer winding;
   a first buffer driver having an input connected to a source of said first MOSFET;
   a second buffer driver having an input connected to a source of said second MOSFET;
   a third MOSFET having a gate connected to said input of said second buffer driver, a source connected to ground and a drain configured to receive an output voltage from said first buffer driver;
   a fourth MOSFET having a gate connected to said input of said first buffer driver, a source connected to ground and a drain configured to receive an output voltage from said second buffer driver;
   a fifth MOSFET having a drain connected to a first terminal of a second transformer winding, a source connected to ground and a gate configured to receive said output voltage from said first buffer driver; and
   a sixth MOSFET having a drain connected to a second terminal of said second transformer winding, a source connected to ground and a gate configured to receive said output voltage from said second buffer driver.

* * * * *

UNITED STATES PATENT AND TRADEMARK OFFICE
CERTIFICATE OF CORRECTION

| | | |
|---|---|---|
| PATENT NO. | : 9,007,793 B2 | Page 1 of 1 |
| APPLICATION NO. | : 13/461303 | |
| DATED | : April 14, 2015 | |
| INVENTOR(S) | : Zhao et al. | |

It is certified that error appears in the above-identified patent and that said Letters Patent is hereby corrected as shown below:

In the Specification

In Column 3, Line 46, delete "V0" and insert -- Vo --, therefor.

In Column 6, Line 6, delete "$V_{in2}$" (Second Occurrence) and insert -- $V_{in2}$, --, therefor.

In Column 6, Line 7, delete "drop)." and insert -- drop. --, therefor.

Signed and Sealed this
Twenty-seventh Day of October, 2015

Michelle K. Lee
*Director of the United States Patent and Trademark Office*